(12) United States Patent
Lenz (10) Patent No.: US 9,379,695 B2
(45) Date of Patent: Jun. 28, 2016

(54) CIRCUIT AND METHOD FOR OPERATING A HALF-BRIDGE

(71) Applicant: Infineon Technologies AG, Neubiberg (DE)

(72) Inventor: Michael Lenz, Zorneding (DE)

(73) Assignee: Infineon Technologies AG, Neubiberg (DE)

( * ) Notice: Subject to any disclaimer, the term of this patent is extended or adjusted under 35 U.S.C. 154(b) by 145 days.

(21) Appl. No.: 14/142,978

(22) Filed: Dec. 30, 2013

(65) Prior Publication Data

US 2015/0188532 A1 Jul. 2, 2015

(51) Int. Cl.
| | |
|---|---|
| *H03K 17/06* | (2006.01) |
| *H03K 5/12* | (2006.01) |
| *H03K 5/02* | (2006.01) |
| *H03K 17/0412* | (2006.01) |
| *H03K 17/16* | (2006.01) |

(52) U.S. Cl.
CPC .............. *H03K 17/063* (2013.01); *H03K 5/023* (2013.01); *H03K 17/04123* (2013.01); *H03K 17/165* (2013.01)

(58) Field of Classification Search
CPC . H03K 5/023; H03K 17/017; H03K 17/0742; H03K 17/0185; H03K 17/01821; H03K 2217/0054; H03K 2217/0063
USPC ................. 327/108–109, 112, 170, 436, 437; 326/24, 27, 82–83
See application file for complete search history.

(56) References Cited

U.S. PATENT DOCUMENTS

| | | | | |
|---|---|---|---|---|
| 6,466,063 | B2 * | 10/2002 | Chen .............................. | 327/112 |
| 7,808,286 | B1 * | 10/2010 | Miller et al. .................. | 327/112 |
| 8,593,211 | B2 * | 11/2013 | Forghani-Zadeh et al. ... | 327/427 |
| 8,736,345 | B2 * | 5/2014 | Yao et al. ...................... | 327/333 |

* cited by examiner

*Primary Examiner* — An Luu
(74) *Attorney, Agent, or Firm* — Viering, Jentschura & Partner mbB (57) ABSTRACT

A circuit for operating a half-bridge is provided. The circuit may include a first multiplier circuit. The first multiplier circuit may be configured to multiply a first signal by a first factor to provide a turn-on signal. The turn-on signal may be configured to turn a first switch of the half-bridge on. The first multiplier circuit may be further configured to multiply the first signal by a second factor to provide a turn-off signal. The turn-off signal may be configured to turn a second switch of the half-bridge off. The first factor and the second factor may be chosen so that the second switch is turned off before the first switch is turned on.

19 Claims, 6 Drawing Sheets

CIRCUIT AND METHOD FOR OPERATING A HALF-BRIDGE

TECHNICAL FIELD

Various embodiments relate generally to circuits and methods for operating a half-bridge.

BACKGROUND

A half-bridge may include two switches connected in series with each other. One of the switches may connect a load to a first reference potential, for example a ground potential, and the other switch may connect the load to a second reference potential, for example a supply potential. The load may be alternately connected to the first reference potential and the second reference potential. If the switches conduct at the same time the first reference potential and the second reference potential are connected to each other and large currents may flow.

A dead time before the load is connected to either the first reference potential or the second reference potential may be introduced during which none of the two switches is conducting. However, the dead time may reduce the switching frequency at which the half-bridge is operated at.

SUMMARY

A circuit for operating a half-bridge is provided. The circuit may include a first multiplier circuit. The first multiplier circuit may be configured to multiply a first signal by a first factor to provide a turn-on signal. The turn-on signal may be configured to turn a first switch of the half-bridge on. The first multiplier circuit may be further configured to multiply the first signal by a second factor to provide a turn-off signal. The turn-off signal may be configured to turn a second switch of the half-bridge off. The first factor and the second factor may be chosen so that the second switch is turned off before the first switch is turned on.

Further, an integrated circuit is provided. The integrated circuit may include a half-bridge circuit and a half-bridge driver circuit. The half-bridge circuit may include a first switch and a second switch coupled in series to each other. The first switch and the second switch may have majority carriers of opposite polarity. The half-bridge driver circuit may be configured to multiply a first current by a first factor to provide a first turn-on current. The first turn-on current may be configured to turn the first switch on. The half-bridge driver circuit may be further configured to multiply the first current by a second factor to provide a first turn-off current. The first turn-off current may be configured to turn the second switch off. The half-bridge driver circuit may be further configured to multiply a second current by a third factor to provide a second turn-on current. The second turn-on current may be configured to turn the second switch on. The half-bridge driver circuit may be further configured to multiply the second current by a fourth factor to provide a second turn-off current. The second turn-off signal may be configured to turn the first switch off. The first current and the second current may be provided alternately. The first factor and the second factor may be chosen so that the second switch is turned off before the first switch is turned on. The third factor and the fourth factor may be chosen so that the first switch is turned off before the second switch is turned on.

Still further, a method for operating a half-bridge is provided. The method may include providing a first signal; scaling the first signal to provide a first turn-on signal, wherein the first turn-on signal may be configured to turn a first switch of the half-bridge on; applying the first turn-on signal to the first switch; scaling the first signal to provide a first turn-off signal, wherein the first turn-off signal may be configured to turn a second switch of the half-bridge off; and applying the first turn-off signal to the second switch. The first turn-on signal and the first turn-off signal may be scaled so that the first turn-off signal turns the second switch off before the first turn-on signal turns the first switch on.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the drawings, the left-most digit(s) of a reference number may identify the drawing in which the reference number first appears. The same numbers may be used throughout the drawings to reference like features and components. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
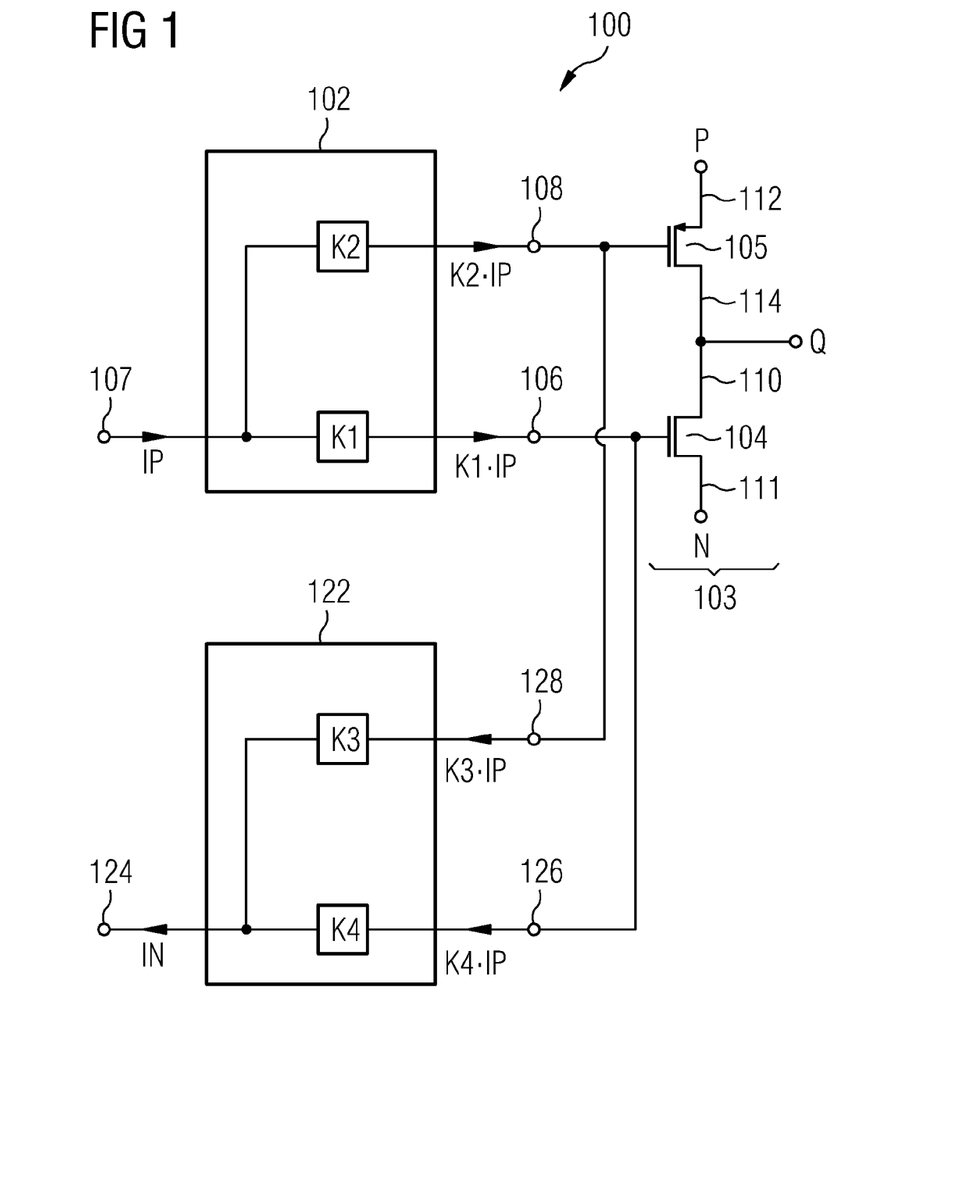
FIG. 1 shows an embodiment of a circuit.

FIG. 1 shows an embodiment of a circuit 100 for controlling a half-bridge. The half-bridge 103 may include a first switch 104 and a second switch 105. The first switch 104 and the second switch 105 may for example be metallic oxide semiconductor field effect transistors (MOS-FET); however, they may also be other kinds of transistors, such as for example bipolar transistors or power switching elements. The first switch 104 may have a first conduction type, for example n-type. The second switch 105 may have a second conduction type, for example p-type, that may be opposite to the first conduction type. In other words, the first switch 104 and the second switch 105 may have majority carriers of opposite polarity.

A first controlled terminal 111, for example a source terminal or an emitter terminal, of the first switch 104 may be coupled to a first reference potential N, for example ground. A first controlled terminal 112, for example a source terminal or an emitter terminal, of the second switch 105 may be coupled to a second reference potential P, for example a supply voltage. A second controlled terminal 110, for example a drain terminal or a collector terminal, of the first switch 104 may be coupled to a second controlled terminal 114, for example a drain terminal or a collector terminal, of the second switch 105. In other words, the first switch 104 and the second switch 105 may be connected in series to each other. A load may be coupled between the first switch 104 and the second switch 105, for example at a node Q at which the second controlled terminal 110 of the first switch 104 and the second controlled terminal 114 of the second switch 105 are coupled to each other.

In various embodiments, the circuit 100 may include a first multiplier circuit 102. The first multiplier circuit 102 may be used to control a half-bridge 103, for example, it may disconnect node Q from the second reference potential P and may connect node Q to the first reference potential N.

In various embodiments, the first multiplier circuit 102 may have an input 107 and a first output 106 and a second output 108. A first signal IP, for example a first current, may be applied to the input 107. The first output 106 may be coupled to a control input, for example a gate or a base, of the first switch 104. The second output 108 may be coupled to a control input, for example a gate or a base, of the second switch 105.

The first multiplier circuit 102 may be configured to multiply the first signal IP applied at its input 107 by a first factor k1. The signal k1·IP may be provided at the first output 106. It may be a turn-on signal for the first switch 104. In other words, signal k1·IP may cause the first switch 104 to conduct, that is, to pass electricity with a low resistance. For example, if the first switch 104 is an NMOS-transistor, the signal k1·IP may increase the voltage between its gate and its source, for example by charging its gate capacitance.

The first multiplier circuit 102 may be further configured to multiply the first signal IP applied at its input 107 by a second factor k2. The signal k2·IP may be provided at the second output 108. It may be a turn-off signal for the second switch 105. In other words, signal k2·IP may cause the second switch 105 to stop conducting, that is, to stop passing electricity with a low resistance. For example, if the second switch 105 is a PMOS-transistor, the signal k2·IP may decrease the voltage between the gate and the source, for example by discharging its gate capacitance.

In various embodiments, the first factor k1 and the second factor k2 may be chosen so that the second switch 105 is turned off before the first switch 104 is turned on. In this way, a cross current or shoot-through is prevented. In other words, the first switch 104 and the second switch 105 do not conduct at the same time. Consequently, they do not connect or short the second reference potential P and the first reference potential N.

In various embodiments, the second factor k2 may be chosen to be larger than the first factor k1. Assuming, for example, that the first switch 104 and the second switch 105 are MOSFETs and have the same gate capacitance, the gate capacitance of the second switch 105 may be charged faster than the gate capacitance of the first switch 104 since current k2·IP is larger than k1·IP. Assuming further that the first switch 104 and the second switch 105 have the same activation threshold, for example a threshold voltage Vth, the second switch 105 may be turned off before the first switch 104 is turned on.

PMOS-transistors may have a lower conductivity than NMOS-transistors. To compensate the lower conductivity, PMOS-transistors with cross-sections that are larger than the cross-section of NMOS-transistors may be used. In this case, the PMOS-transistor may have a larger gate capacitance than the NMOS-transistor. Further, PMOS-transistors may have different activation thresholds, for example threshold voltages Vth, than NMOS-transistors. However, the first factor k1 and the second factor k2 may still be chosen so that the second switch 105 is turned off before the first switch 104 is turned on.

As the signal k1·IP and the signal k2·IP may be derived from the same signal IP, any change in IP will simultaneously affect the turn-on signal for the first switch 104 and the turn-off signal for the second switch 105. Consequently, a change in signal IP should not affect the prevention of cross current.

In various embodiments, the choice of IP may affect the time needed before the first switch 104 is turned on and the time needed before the second switch 105 is turned off as the signals k1·IP and k2·IP determine how fast the respective gate capacitance is charged and when the threshold voltage Vth is reached. Consequently, the first signal IP may be used to set the amount of dead time during which no current flows through both the first switch 104 and the second switch 105. A small signal IP may lead to a large dead time and a large IP may lead to a small dead time. A smaller dead time may allow a higher switching frequency of the half-bridge than a larger dead time.

The first multiplier circuit 102 may turn on the first switch 104 and turn off the second switch 105. However, for operating the half-bridge 103, is may be necessary to do the opposite, that is, to turn off the first switch 104 and turn on the second switch 105. For this, the circuit 100 may include a second multiplier circuit 122. The second multiplier circuit 122 may be used to control the half-bridge 103, for example, it may disconnect a load coupled to node Q from the first reference potential N and connect it to the second reference potential P.

In various embodiments, the second multiplier circuit 122 may have an input 124 and a first output 126 and a second output 128. A second signal IN, for example a second current, may be applied at the input 124. The first output 126 may be coupled to the control input of the first switch 104. The second output 128 may be coupled to a control input of the second switch 105.

The second multiplier circuit 122 may be configured to multiply the second signal IN applied at its input 124 by a third factor k3. The signal k3·IN may be provided at the second output 128. It may be a turn-on signal for the second switch 105. In other words, signal k3·IN may cause the second switch 105 to conduct, that is, to pass electricity with a low resistance. For example, if the second switch 105 is a PMOS-transistor, the signal k3·N may increase the voltage between its gate and its source, for example by charging its gate capacitance.

The second multiplier circuit 122 may be further configured to multiply the second signal IN applied at its input 124 by a fourth factor k4. The signal k4·IN may be provided at the first output 126. It may be a turn-off signal for the first switch 104. In other words, signal k4·IN may cause the first switch 104 to stop conducting, that is, to stop passing electricity with a low resistance. For example, if the first switch 104 is an NMOS-transistor, the signal k4·IN may decrease the voltage between its gate and its source, for example by discharging its gate capacitance.

In various embodiments, the third factor k3 and the fourth factor k4 may be chosen so that the first switch 104 is turned off before the second switch 105 is turned on. In this way, cross current may be prevented.

In various embodiments, the fourth factor k4 may be chosen to be larger than the third factor k3. Assuming, for example, that the first switch 104 and the second switch 105 are MOSFETs and have the same gate capacitance, the gate capacitance of the first switch 104 may be discharged faster than the gate capacitance of the second switch 105 since current k4·IN is larger than k3·IN. Assuming further that the first switch 104 and the second switch 105 have the same threshold voltage Vth, the first switch 104 may be turned off before the second switch 105 is turned on.

The third factor k3 and the fourth factor k4 may be chosen so that the first switch 104 is turned off before the second switch 105 is turned on, even when the first switch 104 and the second switch 105 have different gate capacities and different activation thresholds.

As the signal k3·IN and the signal k4·IN may be derived from the same signal IN, any change in IN will simultaneously affect the turn-off signal for the first switch 104 and the turn-on signal for the second switch 105. Consequently, a change in signal IN should not affect the prevention of cross current.

In various embodiments, the choice of IN may affect the time needed before the first switch 104 is turned off and the time needed before the second switch 105 is turned on as the signals k3·IN and k4·IN determine how fast the gate capacitance is discharged and when the activation threshold is reached. Consequently, the second signal IN may be used to set the amount of dead time during which no current flows through both the first switch 104 and the second switch 105.

The first signal IP and the second signal IN may need to be coordinated as they may provide contradictory signals to the control inputs of the first switch 104 and the second switch 105. For example, the first signal IP may try to turn the first switch 104 on and the second signal IN may try to turn the first switch 104 off. Consequently, the first signal IP and the second signal IN should not be applied at the same time.

Figure 2:
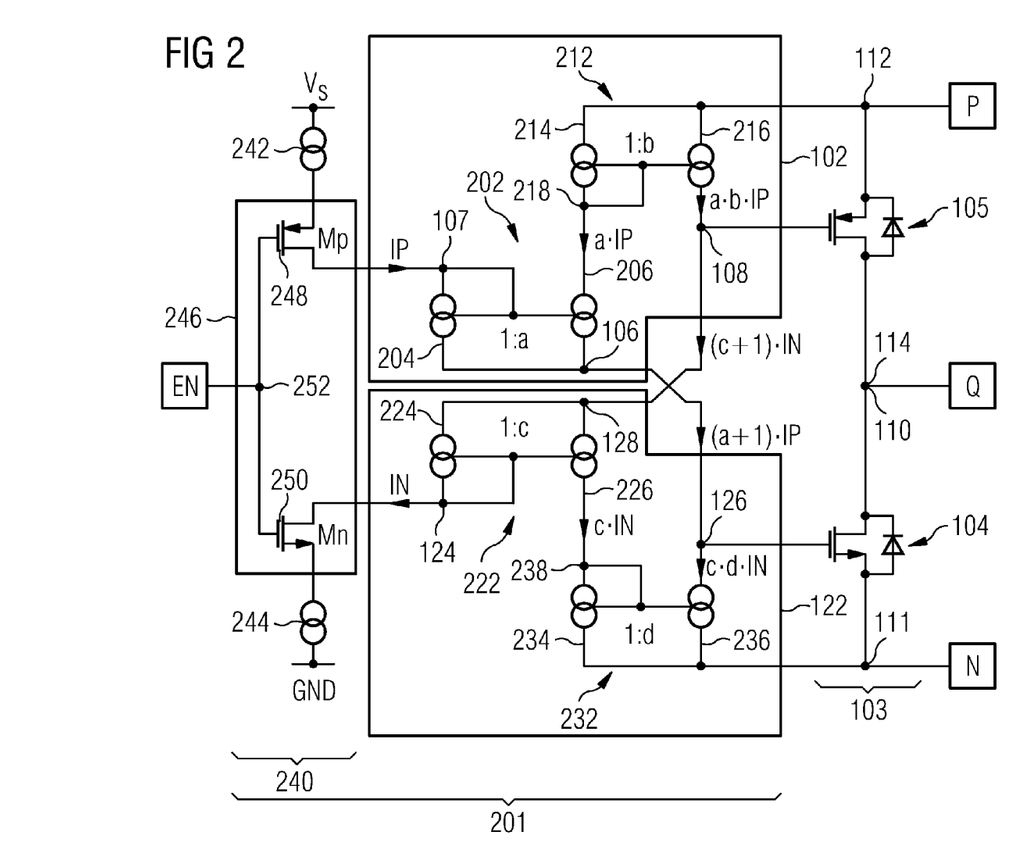
FIG. 2 shows another embodiment of a circuit.

FIG. 2 shows an embodiment of a circuit 200. The circuit 200 may include a half-bridge circuit 103 and a half-bridge driver circuit 201.

The half-bridge circuit 103 may be similar or identical to the half-bridge 103 described in conjunction with FIG. 1.

In various embodiments, the half-bridge driver circuit 201 may include a signal generating circuit 240, a first multiplier circuit 102 and a second multiplier circuit 122. The first multiplier circuit 102 and the second multiplier circuit 122 may be similar to the first multiplier circuit 102 and the second multiplier circuit 122 described in conjunction with FIG. 1. The first multiplier circuit 102 may have an input 107 and outputs 106, 108, and the second multiplier circuit 122 may have an input 124 and outputs 126, 128.

In various embodiments, the first multiplier circuit 102 may include a first current controlled current source 202 and a second current controlled current source 212.

In various embodiments, the first current controlled current source 202 may include a control branch 204 and a controlled branch 206. The ratio of the current flowing in the control branch 204 and the current flowing in the controlled branch 206 may be 1:a. In other words, if a current IP flows in the control branch 204, a current a·IP may flow in the controlled branch 206. In still other words, the current in the control branch 204 may be scaled or multiplied by a factor "a" to provide the current in the controlled branch 206.

The first current controlled current source 202 may for example be a current mirror. A current mirror may include two transistors, where one transistor may be part of the control branch and the other transistor may be part of the controlled branch. The control terminals of the transistors may be connected together and their first controlled terminals may be connected together. The control terminal of the transistor in the control branch may be connected to a second controlled terminal of this transistor. The transistors may be field effect transistors (FET) or bipolar junction transistors (BJP). The control terminal may be a gate or a base, and the controlled terminals may be drains and sources or collectors and emitters.

A first end 107 of the control branch 204 may be configured to receive the first signal IP. The first signal IP may be a current provided by the signal generating unit 240. A second end 106 of the control branch 204 may be coupled to a second end 106 of the controlled branch 206 and to the control input of the first switch 104. A first end 218 of the controlled branch 206 may be coupled to the second switch 105, for example via the second current controlled current source 212.

Assuming that the second multiplier circuit 122 is turned off, a control input of the first switch 104 may be provided with the sum of the current IP flowing through the control branch 204 and the current a·IP flowing through the controlled branch 206. In other words, the first current controlled current source 202 may multiply the first signal IP by the first factor k1=a+1 to provide the turn-on signal (a+1)·IP. The turn-on signal (a+1)·IP may be configured to turn the first switch 104 on.

The first current controlled current source 202 may be floating. In other words, the potentials at the first end 107 of the control branch 204 and at the second ends 106 of the control branch 204 and the controlled branch 206 may assume any potential. The first current controlled current source 202 may therefore act as a level shifter.

In various embodiments, the second current controlled current source 212 may include a control branch 214 and a controlled branch 216. The ratio of the current flowing in the control branch 214 and the current flowing in the controlled branch 216 may be 1:b. In other words, if a current a·IP flows in the control branch 214, a current a·b·IP may flow in the controlled branch 216. The second current controlled current source 212 may for example be a current mirror.

A first end 218 of the control branch 214 may be coupled to the first end 218 of the controlled branch 206 of the first current controlled current source 202. A second end 112 of the control branch 214 may be coupled to a second end 112 of the controlled branch 216 and to the first controlled terminal of the second switch 105.

Assuming that the second multiplier circuit 122 is turned off, a control input of the second switch 105 may be provided with the current a·b·IP of the controlled branch 216. In other words, the first current controlled current source 202 and the second current controlled current source 212 may multiply the first signal IP by a second factor k2=a·b to provide a first turn-off signal a·b·IP. The first turn-off signal a·b·IP may be configured to turn the second switch 105 off.

Figure 3:
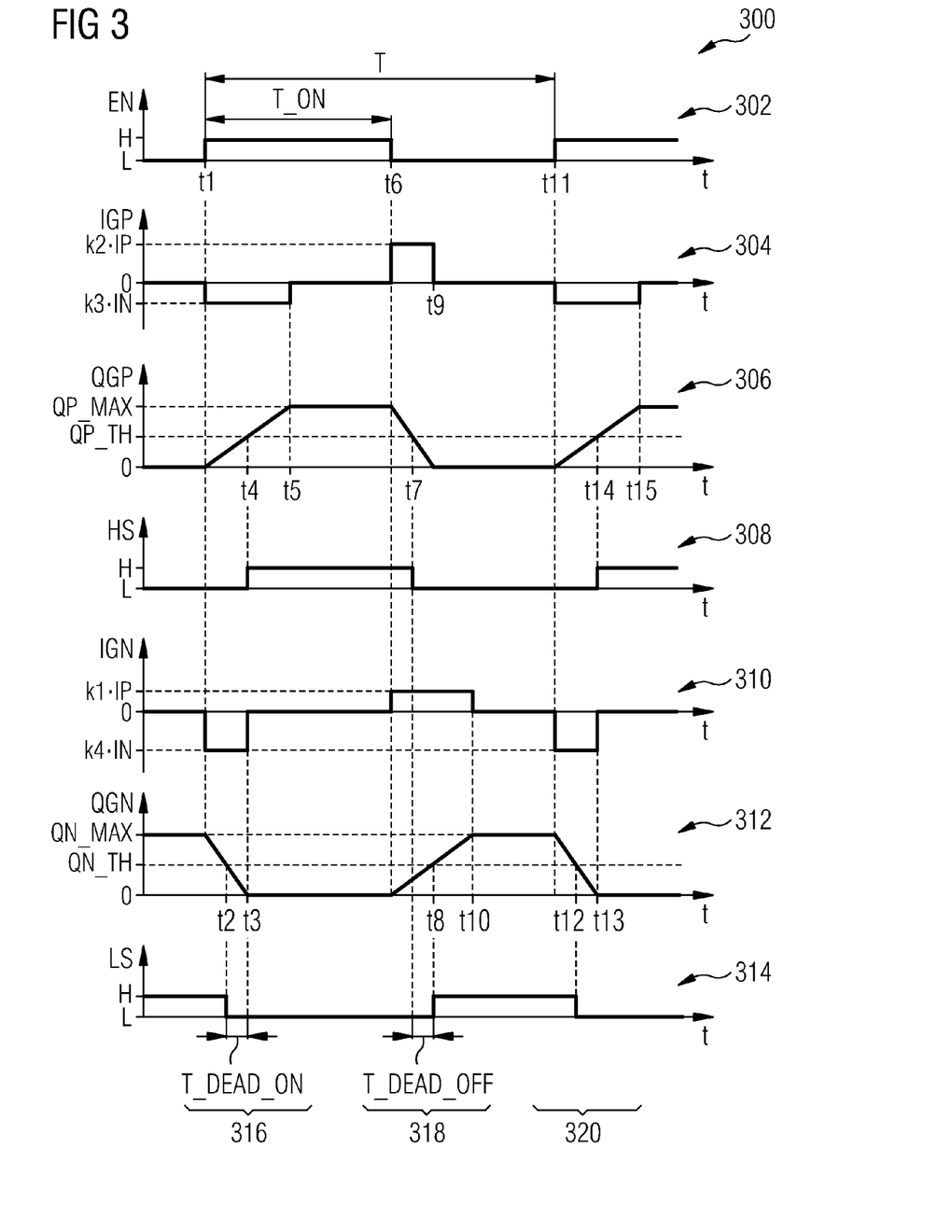
FIG. 3 shows an embodiment of waveforms.

The first factor k1=a+1 and the second factor k2=a·b may be chosen so that the second switch 105 may be turned off before the first switch 104 is turned on, as described in conjunction with FIG. 1 and further illustrated in FIG. 3.

In various embodiments, the second multiplier circuit 122 may be similar to the first multiplier circuit 102. It may include a third current controlled current source 222 and a fourth current controlled current source 232.

In various embodiments, the third current controlled current source 222 may include a control branch 224 and a controlled branch 226. The ratio of the current flowing in the control branch 224 and the current flowing in the controlled branch 226 may be 1:c. In other words, if a current IN flows in the control branch 224, a current c·IN may flow in the controlled branch 226. The third current controlled current source 222 may for example be a current mirror. A first end 124 of the control branch 224 may be configured to receive the second signal IN. The second signal IN may be a current provided by the signal generating unit 240. A second end 128 of the control branch 224 may be coupled to a second end 128 of the controlled branch 226 and to the control input of the second switch 105. A first end 238 of the controlled branch 226 may be coupled to the first switch 104, for example via the fourth current controlled current source 232.

Assuming that the first multiplier circuit 102 is turned off, a control input of the second switch 105 may be provided with the sum of the current IN flowing through the control branch 224 and the current c·IN flowing through the controlled branch 226. In other words, the third current controlled current source 222 may multiply the second signal IN by the third factor k3=c+1 to provide the turn-on signal (c+1)·N. The turn-on signal (c+1)·IN may be configured to turn the second switch 105 on.

The third current controlled current source 222 may be floating. In other words, the potentials at the first end 124 of the control branch 224, and at the second ends 128 of the control branch 224 and the controlled branch 226 may assume any potential. The third current controlled current source 222 may therefore act as a level shifter.

In various embodiments, the fourth current controlled current source 232 may include a control branch 234 and a controlled branch 236. The ratio of the current flowing in the control branch 234 and the current flowing in the controlled branch 236 may be 1:d. In other words, if a current c·IN flows in the control branch 234, a current c·d·IN may flow in the controlled branch 236. The fourth current controlled current source 232 may for example be a current mirror.

A first end 238 of the control branch 234 may be coupled to the first end 238 of the controlled branch 226 of the third current controlled current source 222. A second end 111 of the control branch 234 may be coupled to a second end 111 of the controlled branch 236 and to the first controlled terminal 111 of the first switch 104.

Assuming that the first multiplier circuit 102 is turned off, a control input of the first switch 104 may be provided with the current c·d·IN of the controlled branch 236. In other words, the third current controlled current source 222 and the fourth current controlled current source 232 may multiply the second signal IN by a fourth factor k4=c·d to provide a turn-off signal c·d·IN. The turn-off signal c·d·IN may be configured to turn the first switch 104 off.

The third factor k3=c+1 and the fourth factor k4=c·d may be chosen so that the first switch 104 may be turned off before the second switch 105 is turned on, as described in conjunction with FIG. 1 and further illustrated in FIG. 3.

In various embodiments, the signal generating circuit 240 may be configured to provide the first signal IP and the second signal IN. It may include a first generating unit 242, a second generating unit 244 and a control circuit 246. The first generating unit 242 may couple the control circuit 246 to a second potential Vs and the second generating unit 244 may couple the control circuit 246 to a first potential GND. The second potential Vs may be the same as the second reference potential P. The first potential GND may be the same as the first reference potential N.

The first generating unit 242 may be configured to provide the first signal IP. The first generating unit 242 may include a fifth current controlled current source, which may for example be a current mirror. A control branch of the fifth current controlled current source may be supplied with a control current. The control current may be scaled to provide the first signal IP in the controlled branch of the fifth current controlled current source 242.

The second generating unit 244 may be configured to provide the second signal IN. The second generating unit 244 may include a sixth current controlled current source, which may for example be a current mirror. A control branch of the sixth current controlled current source may be supplied with a control current. The control current may be scaled to provide the second signal IN in the controlled branch of the sixth current controlled current source 244.

In various embodiments, the control current of the fifth current controlled current source 242 and the control current of the sixth current controlled current source 244 may be the same. In other words, a change in the control current will provide a change in both the first signal IP and the second signal IN.

The control circuit 246 may be configured to activate only one of the first generating unit 242 and the second generating unit 244 at a given time. In other words, only one of the first signal IP or the second signal IN is provided at a given time. The first signal IP and the second signal IN may be mutually exclusive.

The control circuit 246 may include an input EN, a third switch 248 and a fourth switch 250. The input EN may be coupled to a control terminal of the third switch 248 and to a control terminal of the fourth switch 250 at node 252.

A controlled terminal of the third switch 248 may be coupled to the first generating unit 242, for example to the controlled branch of the fifth current controlled current source. Another controlled terminal of the third switch 248 may be coupled to the input 107 of the first multiplier circuit 102. The third switch 248 may control if the first signal IP is passed or not to the first multiplier circuit 102.

A controlled terminal of the fourth switch 250 may be coupled to the second generating unit 244, for example to the controlled branch of the sixth current controlled current source. Another controlled terminal of the fourth switch 250 may be coupled to the input 124 of the second multiplier circuit 122. The fourth switch 250 may control if the second signal IN is passed or not to the second multiplier circuit 122.

The third switch 248 and the fourth switch 250 may be configured so that the third switch 248 is conducting and, at the same time, the fourth switch 250 is non-conducting for a first state of a signal at the input EN. The third switch 248 and the fourth switch 250 may be further configured so that the third switch 248 is non-conducting and, at the same time, the fourth switch 250 is conducting for a second state of signal at the input EN, where the second state of the signal may be different or opposite from the first state. For example, the third switch 248 may be a p-type transistor that is conducting when the signal at the input EN has a low-value in its first state and is non-conducting when the signal has a high-value in its second state and the fourth switch 250 may be an n-type transistor that is non-conducting when the signal at the input EN has a low-value in its first state and is conducting when the signal has a high-value in its second state. Depending on the value of the signal at the input EN, the signal generating circuit 240 may therefore provide either the first signal IP or the second signal IN.

The signal at the input EN may be a digital signal. It may alternate between its first state and its second state. The sum of the duration of the first state and the duration of the second state may determine an operating frequency of the half-bridge 103. The duration of the second state may be used to set a duty cycle for a load connected to node Q.

FIG. 3 shows an embodiment 300 of diagrams 302, 304, 306, 308, 310, 312 and 314. As an example, the diagrams are shown for the case that the first switch 104 is an NMOS-transistor and the second switch 105 is a PMOS-transistor. However, the diagrams may also apply or be modified for different types of switches operating with different types of signals.

Diagram 302 may show a signal at the terminal EN over time t. The signal may be a digital signal with logical values low L and high H.

Diagram 304 may show a current flow IGP at the gate of the second switch 105 over time t. A positive value of IGP may indicate that current, for example in the form of electrons, flows into the gate, a negative value may indicate that current flows out of the gate.

Diagram 306 may show a charge QGP at the gate of the second switch 105 over time t. Charge QGP may be an integral of current flow IGP over time t.

Diagram 308 may show a conduction state HS of the second switch 105 over time t. The conduction state may be shown as digital, with a low-value L indicating that the second switch 105 is non-conducting and a high-value H indicating that the second switch 105 is conducting.

Diagram 310 may show a current flow IGN at the gate of the first switch 104 over time t. A positive value may indicate that current, for example in the form of electrons, flows into the gate, a negative value may indicate that current flows out of the gate.

Diagram 312 may show a charge QGN at the gate of the first switch 104 over time t. Charge QGN may be an integral of current flow IGN over time t.

Diagram 314 may show a conduction state LS of the first switch 104 over time t. The conduction state may be shown as digital, with a low-value L indicating that the first switch 104 is non-conducting and a high-value H indicating that the first switch 104 is conducting.

FIG. 3 may illustrate how the first switch 104 is turned off before the second switch 105 is turned on, see for example time intervals 316 and 320, and how the second switch 105 is turned off before the first switch 104 is turned on, see for example time interval 318.

Before time t1, the signal at the terminal EN may be at a logic low-value L. The charge QGP at the gate of the second switch 105 may be at its minimum value zero, in other words, the gate of the second switch 105 may be fully discharged, and no current IGP flows into the gate of the second switch 105. If the second switch 105 is a PMOS-transistor, it may be non-conducting, as is shown by the logic low-value L of signal HS in diagram 308. The charge QGN at the gate of the first switch 104 may be at its maximum value QN_MAX, in other words, the gate of the first switch 104 may be fully charged, and no current IGN flows into the gate of the first switch 104. If the first switch 104 is an NMOS-transistor, it may be conducting, as is shown by the logic high-value H of signal LS in diagram 314.

During time interval 316, the first switch 104 is turned off before the second switch 105 is turned on. At time t1, the signal at the terminal EN may change from a logic low-value L to a logic high-value H and may activate the current generating circuit 240 to provide current IN generated by the second current generating unit 244. The second multiplying circuit 122 may provide current IGP=k3·IN to the second switch 105 and current IGN=k4·IN to the first switch 104, see diagrams 304 and 310 and also FIG. 1.

Current IGP=k3·IN may flow into the gate of the second switch 105 and may increase the charge QGP on the gate of the second switch 105, as is shown in diagram 306. At time t4, the charge QGP may have been increased to the threshold charge QP_TH. The threshold charge QP_TH may be a charge at which the second switch 105 starts or stops conducting. At time t4, the second switch 105 may start conducting as is shown by the logic high-value H of signal HS in diagram 308. Current IGP may continue to remove charge from the gate of the second switch 105 until, at time t5, the maximum QP_MAX is reached and current IGP stops to flow, see diagrams 306 and 304.

Similarly, current IGN=k4·IN may flow out of the gate of the first switch 104 and may reduce the charge QGN of the gate of the first switch 104, as is shown in diagram 312. At time t2, the charge QGN may have been reduced to a threshold charge QN_TH. The threshold charge QN_TH may be a charge at which the first switch 104 starts or stops conducting. At time t2, the first switch 104 stops conducting as is shown by the logic low-value L of signal LS in diagram 314. Current IGN may continue to remove charge from the gate of the first switch 104 until, at time t3, there is no charge QGN left and current IGN stops to flow, see diagrams 312 and 310.

The first switch 104 may be turned off at time t2 and the second switch 105 may be turned on at time t4, which is after time t2. Therefore, there may be a turn-on dead time T_DEAD_ON=t4−t2, see diagram 314, during which neither the first switch 104 nor the second switch 105 is conducting and cross current may be prevented. Time t2 may depend on the initial charge QN_MAX on the gate of the first transistor 104, the gate capacity CN and the threshold charge QN_TH of the first transistor 104 and the current k4·IN. Time t4 may depend on the initial charge QP_MAX on the gate to the second transistor 105, the gate capacity CP and the threshold charge QP_TH of the second transistor 105, and the current k3·IN. The turn-on dead time T_DEAD_ON may for example be 10 to 15 ns.

The charges QN_MAX and QP_MAX may be the same. The gate capacities CN and CP may be the same. The threshold charges QN_TH and QP_TH may be the same. However, the respective two values may be different from each other, for example if the first switch 104 and the second switch 105 have different conduction types and are dimensioned differently to compensate for different conductivities. For example, the majority carriers in PMOS-transistors may have a conductivity that is less than the conductivity of majority carriers in NMOS-transistors. The PMOS-transistor may therefore be designed with a greater cross-section and therefore with a larger gate than the NMOS-transistor. The gate capacitances CN and CP may be different and the initial charges QN_MAX and QP_MAX may be different.

The slope over time t at which charge is removed may be proportional to the current which removes the charge. For example, as is shown in diagrams 304, 306 and 310, 312, the slope of QGN may be steeper than the slope of QGP if the current IGN=k4·IN is larger than the current IGP=k3·IN. Taking the values of QN_MAX and QP_MAX, CP and CN, QN_TH and QP_TH into account, the factors k3 and k4 may be chosen so that t2<t4. For example, k3 may be chosen to be k3=11 and k4 to be k4=20.

A change in current IN may affect the steepness and therefore the times t2 and t4, however, it should not change the relation t2<t4 if the values of QN_MAX, QP_MAX, CP, CN, QN_TH and QP_TH remain unchanged.

During time interval 318, the second switch 105 is turned off before the first switch 104 is turned on. At time t6, after a time T_ON starting from time t1, the signal at the terminal EN may change from a logic high-value H to a logic low-value L, see diagram 302. Time T_ON may define a duty cycle with which the half-bridge is operated. For example, if T_ON is small, a load connected to node Q and to the first reference potential N may be supplied with less energy than when T_ON is larger. The load may therefore be controlled by pulse width modulation (PWM).

At time t6, the change of the signal at the terminal EN may activate the current generating circuit 240 to provide current IP generated by the first current generating unit 242. The first multiplying circuit 102 may provide current IGP=k2·IP to the second switch 105 and current IGN=k1·IP to the first switch 104, see diagrams 304, 310 and also FIG. 1. Current IGP=k2·IP may flow out of the gate of the second switch 105 and may decrease the charge QGP on the gate of the second switch 105, as is shown in diagram 306. At time t7, the charge QGP may have been decreased to the threshold charge QP_TH and the second switch 105 stops conducting as is shown by the logic low-value L of signal HS in diagram 308. Current IGP may continue to discharge the gate of the second switch 105 until, at time t9, the gate is fully discharged to zero and current IGP stops to flow, see diagrams 306 and 304.

Similarly, current IGN=k1·IP may flow into the gate of the first switch 104 and may increase the charge QGN on the gate of the first switch 104, as is shown in diagram 312. At time t8, the charge QGN may have been increased to the threshold charge QN_TH and the first switch 104 starts conducting, as is shown by the logic high-value H of signal LS in diagram 314. Current IGN may continue to add charge to the gate of the first switch 104 until, at time t10, the gate is fully charged to QN_MAX and current IGN stops to flow, see diagrams 312 and 310.

The second switch 105 may be turned off at time t7 and the first switch 104 may be turned on at time t8, which is after time t7. Therefore, there may be a turn-off dead time T_DEAD_OFF=t8−t7, see diagram 314, during which neither the first switch 104 nor the second switch 105 is conducting and cross current may be prevented. Time t7 may depend on the gate capacity CP and the threshold charge QP_TH of the second transistor 105 and the current k2·IP. Time t8 may depend on the gate capacity CN and the threshold charge QN_TH of the first transistor 104 and the current k1·IP. The turn-off dead time T_DEAD_OFF may for example be 10 to 15 ns. The gate capacities CN and CP may be the same. The threshold charges QN_TH and QP_TH may be the same. However, they may be different, for example if the first switch 104 and the second switch 105 have different conduction types.

The slope over time t at which charge is added may be proportional to the current adding the charge. For example, as is shown in diagrams 304, 306 and 310, 312, the slope of QGP may be steeper than the slope of QGN if the current IGP=k2·IP is larger than the current IGN=k1·IP. Taking the value of the gate capacitances CP and CN and the charge thresholds QN_TH and QP_TH into account, the factors k1 and k2 may be chosen so that t7<t8. For example, k1 may be chosen to be k1=11 and k2 to be k2=20.

A change in current IP may affect the steepness and therefore times t7 and t8, however, it should not change the relation t7<t8 if the values of CP, CN, QN_TH and QP_TH remain unchanged.

During time interval 320, the first switch 104 may again be turned off before the second switch 105 is turned on. Time interval 320 may start at time t11, after a time T from time t1, and the signals may have the same waveforms as in time interval 316, with t12=t2; t13=t3; t14=t4 and t15=t5. The signals shown in embodiment 300 may be periodic with a frequency f=1/T. Frequency f may be a frequency at which the half-bridge is operated. As an example, frequency f may be f=20 to 200 kHz, or f=1 MHz.

Frequency f may be limited by the turn-off dead time T_DEAD_OFF and the turn-on dead time T_DEAD_ON. Factors k1, k2 may be chosen so that the turn-off dead time T_DEAD_OFF is minimized. Factors k3, k4 may be chosen so that the turn-on dead time T_DEAD_ON is minimized. The factors k1, k2, k3 and k4 may be matched to the first switch 104 and the second switch 105, for example with respect to the gate capacities CP, CN, the activation thresholds QN_TH, QP_TH and the initial charges QN_MAX, QP_MAX.

An integrated circuit, for example a monolithically integrated circuit, may include the half-bridge driver circuit 201 with the signal generating circuit 240 and the half-bridge circuit 103. The half-bridge driver circuit 201 and the half-bridge circuit 103 may be matched to each other, for example to minimize dead times in order to increase the operating frequency f.

Figure 4A:
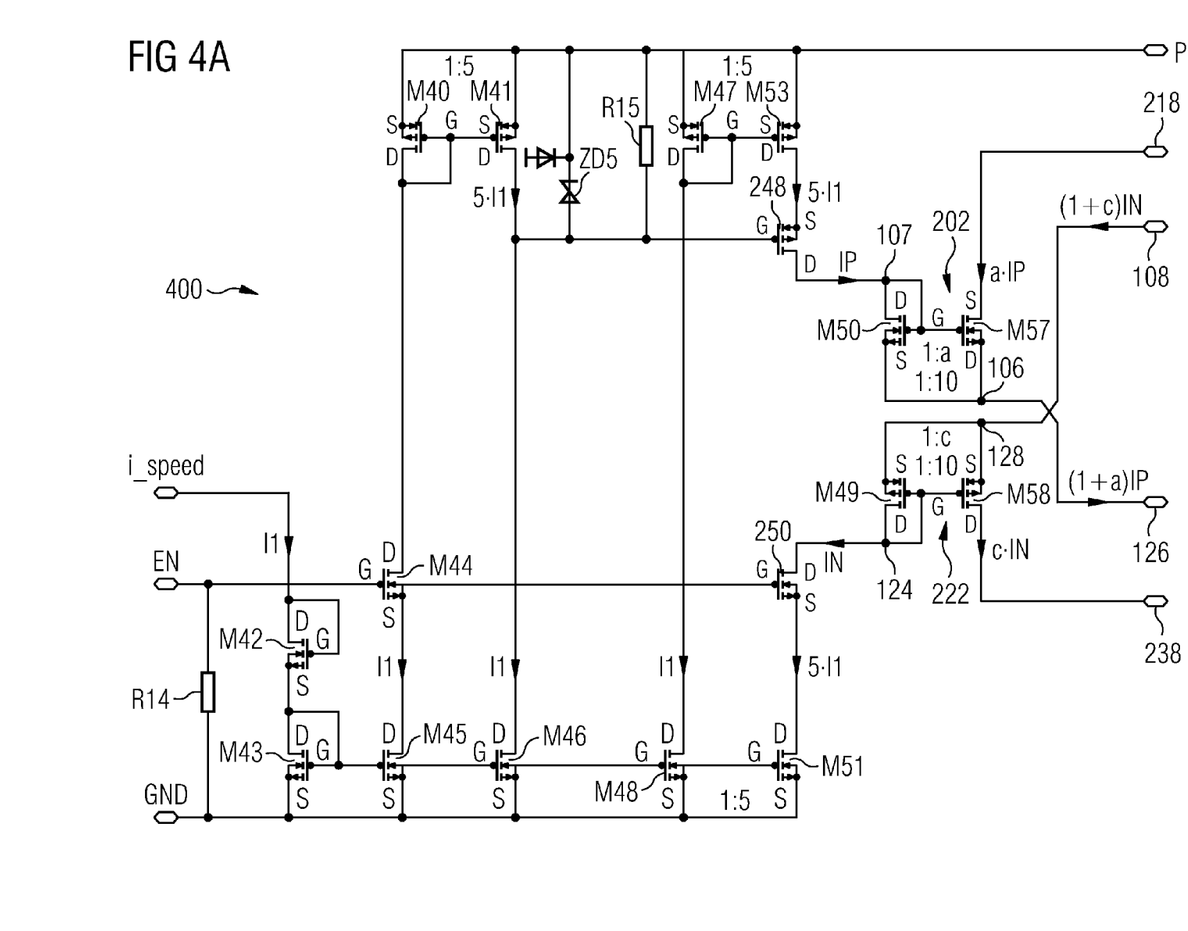
FIGS. 4A and 4B show still another embodiment of a circuit.
Figure 4B:
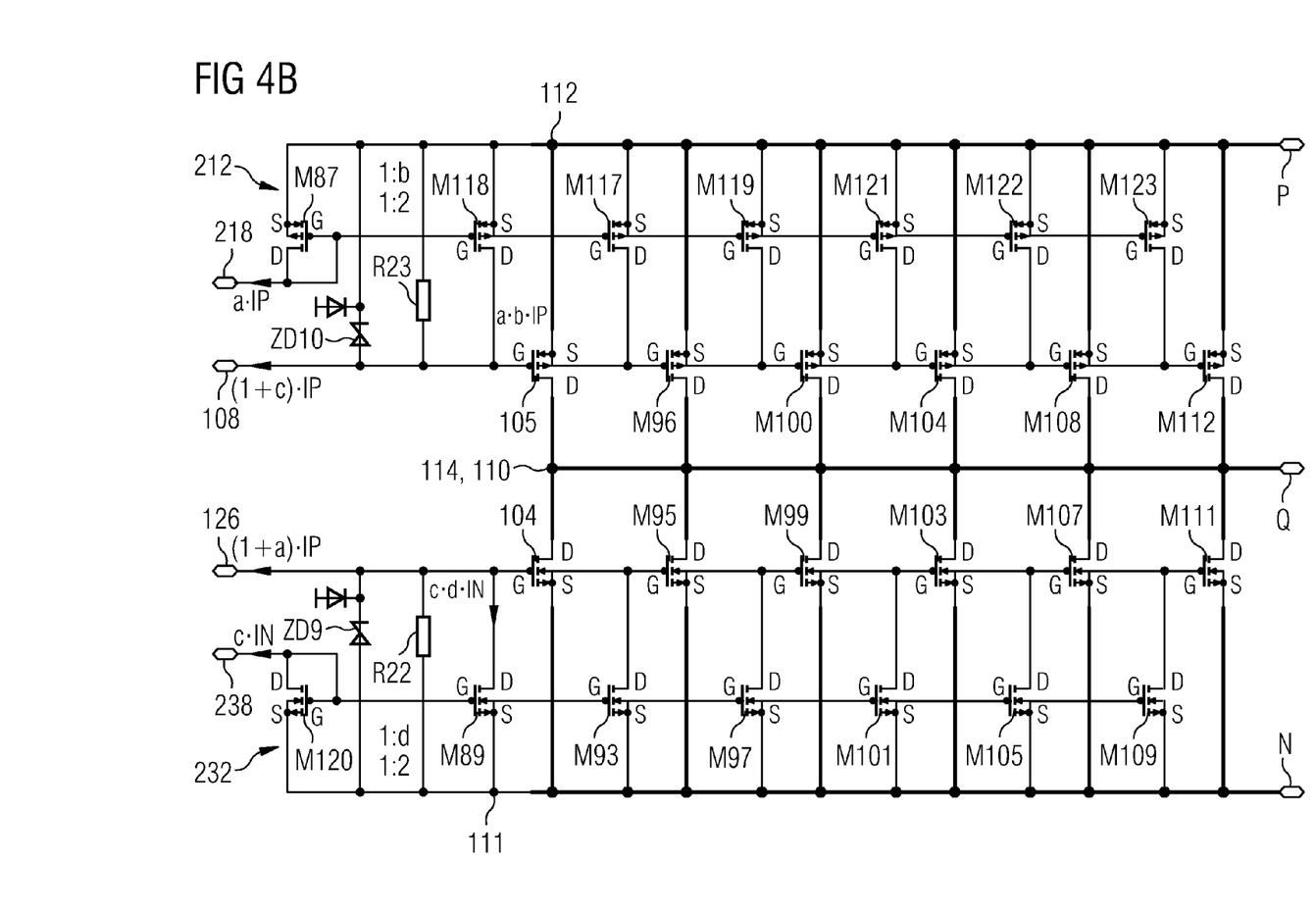

FIG. 4A and FIG. 4B show an embodiment 400 of a circuit. The circuit may implement some or all features of the embodiments 100, 200 and 300 described above. For reasons of presentation, the circuit is shown using two figures, FIG. 4A and FIG. 4B, which are coupled via nodes P, 218, 108, 126 and 238.

The circuit may have terminals i_speed, EN, GND, P, Q and N. It may have resistors R14, R15, R22, R23, zener diodes ZD5, ZD9, ZD10, p-type transistors M40, M41, M47, M53, 248, M49, M58, M87, M118, M117, M119, M121, M122, M123, 105, M96, M100, M104, M108, M112, and n-type transistors M42, M43, M44, M45, M46, M48, M51, 250, M50, M57, 104, M95, M99, M103, M107, M111, M120, M89, M93, M97, M101, M105, M109. The transistors may be MOSFETs.

First, the part of the circuit shown in FIG. 4A is described. Terminal i_speed may be connected to a drain D of transistor M42, which may have its gate G connected to its drain D. Transistor M42 may act as a diode and may provide a threshold voltage which a signal applied to terminal i_speed must exceed before it is passed onto the rest of the circuit. The signal applied to terminal i_speed may be the signal that the first signal IP and the second signal IN are derived from. It may be a control current I1. The signal applied to terminal i_speed may set the switching speed, or in other words, the slope or the slew rate at which the first switch 104 and the second switch 105 are switched.

The source S of transistor M42 may be connected to the drain D of transistor M43. The sources S of transistors M43, M45, M46, M48 and M51 may be coupled to terminal GND. The gate G of transistor M43 may be connected to its drain D and to the gates G of transistors M45, M46, M48, and M51. Transistor M43 may be the control branch and transistors M45, M46, M48, and M51 may be the respective controlled branches of respective current sources. Current I1 flowing through transistor M43 may be mirrored 1:1 in transistors M45, M46, M48 and be mirrored 1:5 in transistor M51. Resistor R14 may be coupled between terminals EN and GND to prevent terminal EN from floating.

Terminal EN may be connected to the gates G of transistors M44 and 250, where the source S of transistor M44 is coupled to the drain D of transistor M45 and source S of transistor 250 is coupled to the drain D of transistor M51.

Terminal P may be connected to the respective sources S of the transistors M40, M41, M47 and M53. The gate G of transistor M40 may be coupled to its drain D and to the gate of transistor M41. Transistors M40 and M41 may form a current mirror with ratio 1:5. The drain D of transistor M40 may be connected to the drain D of transistor M44. The drain D of transistor M41 may be connected to the drain D of transistor M46 and to the gate G of transistor 248. The gate G of transistor M47 may be connected to its drain D and to the gate of transistor M53 and to the drain D of M48. Transistors M47 and M53 may form a current mirror with ratio 1:5. The drain D of transistor M53 may be connected to the source S of transistor 248. The zener diode ZD5 and the resistor R15 may be coupled between terminal P and the gate of transistor 248 to protect the gate from over-voltages and from floating.

The connections described so far may present the signal generating unit 240 shown in FIG. 2. Transistor 248 may correspond to the third switch 248 and transistor 250 may correspond to the fourth switch 250 in FIG. 2. When the signal at terminal EN has a logical low-value L, transistors M44 and 250 are deactivated, that is non-conducting. No current flows through the current mirror made up of transistors M40, M41 and no current IN is provided at the drain D of transistor 250 at node 124. A current I1 may be mirrored from transistor M43 to transistor M46. Zener diode ZD5 and resistor R15 may supply transistor M46 with current I1 and may set the potential of gate G of transistor 248 to be below the potential at its source S so that transistor 248 is conducting. Current I1 may also be mirrored to transistor M48 which may supply the current mirror made up of transistors M47, M53. Transistor M47 and transistor M53 may be configured as the fifth current controlled current source in the first generating unit 242. Current I1 may be mirrored from transistor M43 to transistor M51 with a 1:5 ratio. Consequently, a current IP=5·I1 may be provided at the drain D of transistor 248 at node 107.

When the signal at terminal EN has a logical high-value H, transistors M44 and 250 are activated, that is conducting. Current I1 may be mirrored from transistor M43 to transistor M45 and M46 with a 1:1 ratio. Current I1 may be mirrored from transistor M40 to transistor M41 with a 1:5 ratio. The difference in current through the transistors M46 and M41 of 5·I1−I1=4·I1 current clamps the gate of 248 with the RDSON of M41 to the potential P−RDSON41·I1. The potential of gate G of transistor 248 is set close to the potential at its source S so that transistor 248 is non-conducting. No current flows through the current mirror made up of transistors M47, M53 and no current IP is provided at node 107. Transistor M43 and transistor M51 may be configured as the sixth current controlled current source in the second generating unit 244. Current I1 may be mirrored from transistor M43 to transistor M51 with a 1:5 ratio. Consequently, a current IN=5.11 may be provided at node 124.

Both current IN=5·I1 and IP=5·I1 may be controlled by the same control current I1 and, depending on the state of the signal at terminal EN, either current IN or current IP may be provided at the respective nodes 124, 107.

Now, the first current controlled current source 202 will be described. The drain D of transistor M50 may be connected to node 107, to gate G of transistor M50 and to gate G of transistor M57. The sources S of transistors M50 and M57 may be connected together at node 106. The drain D of transistor M57 may be connected to node 218. Transistor M50 and transistor M57 may be configured as a current mirror with ratio 1:a, for example with a=10. A current IP flowing into node 107 and through transistor M50 may be mirrored into a current a·IP through transistor M57. A current (1+a)·IP may leave node 106 and be available at node 126, which may have the same potential as node 106.

Now, the third current controlled current source 222 will be described. The drain D of transistor M49 may be connected to node 124, to gate G of transistor M49 and to gate G of transistor M58. The sources S of transistors M49 and M58 may be connected together at node 128. The drain D of transistor M58 may be connected to node 238. Transistor M49 and transistor M58 may be configured as a current mirror with ratio 1:c, for example with c=10. A current IN leaving node 124 and flowing through transistor M49 may be mirrored into a current c·IN through transistor M58. A current (1+c)·IN may flow into node 128, for example via node 108, which may have the same potential as node 128.

Depending on the logical value of the signal at terminal EN, currents a·IP=5·a·I1=50·I1 and (1+a)·IP=5·(1+a)·I1=55·I1 may be available at node 218 and node 106, respectively, or currents c·IN=5·c·I1=50·I1 and (1+c)·IN=5·(1+c)·I1=55·I1 may be provided at node 238 and node 128, respectively.

Nodes P, 218, 108, 126 and 238 may form an interface between the part of the circuit shown in FIG. 4A and the part of the circuit shown in FIG. 4B. Now, the part shown in FIG. 4B is described.

Now, the second current controlled current source 212 will be described. The drain D of transistor M87 may be connected to node 218, to gate G of transistor M87 and to gate G of transistor M118. The sources S of transistors M87 and M118 may be connected together at node 112 which may be at the same potential as terminal P. The drain D of transistor M118 may be connected to node 108 and to gate G of transistor 105. Transistor M87 and transistor M118 may be configured as a current mirror 212 with ratio 1:b, for example with b=2. A current a·IP leaving node 108 and flowing through transistor M87 may be mirrored into a current a·b·IP=10·2·5·I1=100·I1 through transistor M118.

Zener diode ZD10 and resistor R23 may each be connected between node 112 and node 108. Together with transistor M118, they may determine the potential of node 108 and may so control transistor 105. Zener diode ZD10 may limit the potential of node 108, for example to be less than 11 V, and resistor R23 may prevent node 108 from floating.

Now, the fourth current controlled current source 232 will be described. The drain D of transistor M120 may be connected to node 238, to gate G of transistor M120 and to gate G of transistor M89. The sources S of transistors M120 and M89 may be connected together at node 111 which may be at the same potential as terminal N. The drain D of transistor M89 may be connected to node 126 and to gate G of transistor 104. Transistor M120 and transistor M89 may be configured as a current mirror with ratio 1:d, for example with d=2. A current c·IN entering node 238 and flowing through transistor M120 may be mirrored into a current c·d·IN=10·2·5·I1=100·I1 through transistor M89.

Zener diode ZD9 and resistor R22 may each be connected between node 126 and node 111. Together with transistor M89 they may determine the potential of node 126 and may so control transistor 104. Zener diode ZD9 may limit the potential of node 126, for example to be less than 11 V, and resistor R22 may prevent node 126 from floating.

Transistor 104 may correspond to the first switch 104. Its controlled terminals may be connected to terminal N and terminal Q, respectively. It may set the potential at terminal Q to the potential at terminal N, for example to GND. However, transistors M95, M99, M103, M107 and M111 may be connected in parallel to transistor 104, that is, their controlled terminals may be connected to terminal N and terminal Q, respectively, to increase the current switching ability of the circuit. Each transistor M95, M99, M103, M107 and M111 may have a respective transistor M93, M97, M101, M105 and M109 that may accelerate the switch-off of the transistor. Each of the gates G of the transistors M95, M99, M103, M107 and M111 may be connected to the gate G of transistor 104, to node 126 and to a drain D of the respective transistor M93, M97, M101, M105 and M109. The sources S of the respective transistors M93, M97, M101, M105 and M109 may be connected to node 111 and the gates G may be connected to the gate of transistor M120. The respective transistors M93, M97, M101, M105 and M109 may be configured as controlled branches of current mirrors. They may mirror current c·IN flowing through transistor M120 with a ratio 1:2, just like transistor M89 mirrors the current flowing through transistor M120 and the discharge current capability for the gate-node 126 is increased.

Transistor 105 may correspond to the second switch 105. Its controlled terminals may be connected to terminal P and terminal Q, respectively. It may set the potential at terminal Q to the potential at terminal P, for example to supply potential. However, transistors M96, M100, M104, M108 and M112 may be connected in parallel to transistor 105, that is, their controlled terminals may be connected to terminal P and terminal Q, respectively, to increase the current switching ability of the circuit. Each transistor M96, M100, M104, M108 and M112 may have a respective transistor M117, M119, M121, M122 and M123 that may accelerate the switch-off of the respective transistor. Each of the gates G of the transistors M96, M100, M104, M108 and M112 may be connected to gate G of transistor 105, to node 108 and to a drain D of the respective transistor M117, M119, M121, M122 and M123. The sources S of the respective transistors M117, M119, M121, M122 and M123 may be connected to node 112 and their gates G may be connected to the gate of transistor M87. The transistors M117, M119, M121, M122 and M123 may be configured as controlled branches of current mirrors. They may mirror current a·IP flowing through transistor M87 with a ratio 1:2, just like transistor M118 mirrors the current flowing through transistor M87 and the discharge current capability for the gate-node 108 is increased.

The circuits described in conjunction with embodiments 100, 200, 300, and 400 may be used to drive any kind of load, for example, resistive, capacitive or inductive. The load may for example be a motor, a lamp or a pump. The circuits may be used as a gate driver, for example for an NMOS-transistor, a PMOS-transistor, or in a buck converter or a boost converter. The circuits may be provided in duplicate to operate a P-NMOS-transistor half-bridge, an H-bridge or a buck-boost converter.

Figure 5:
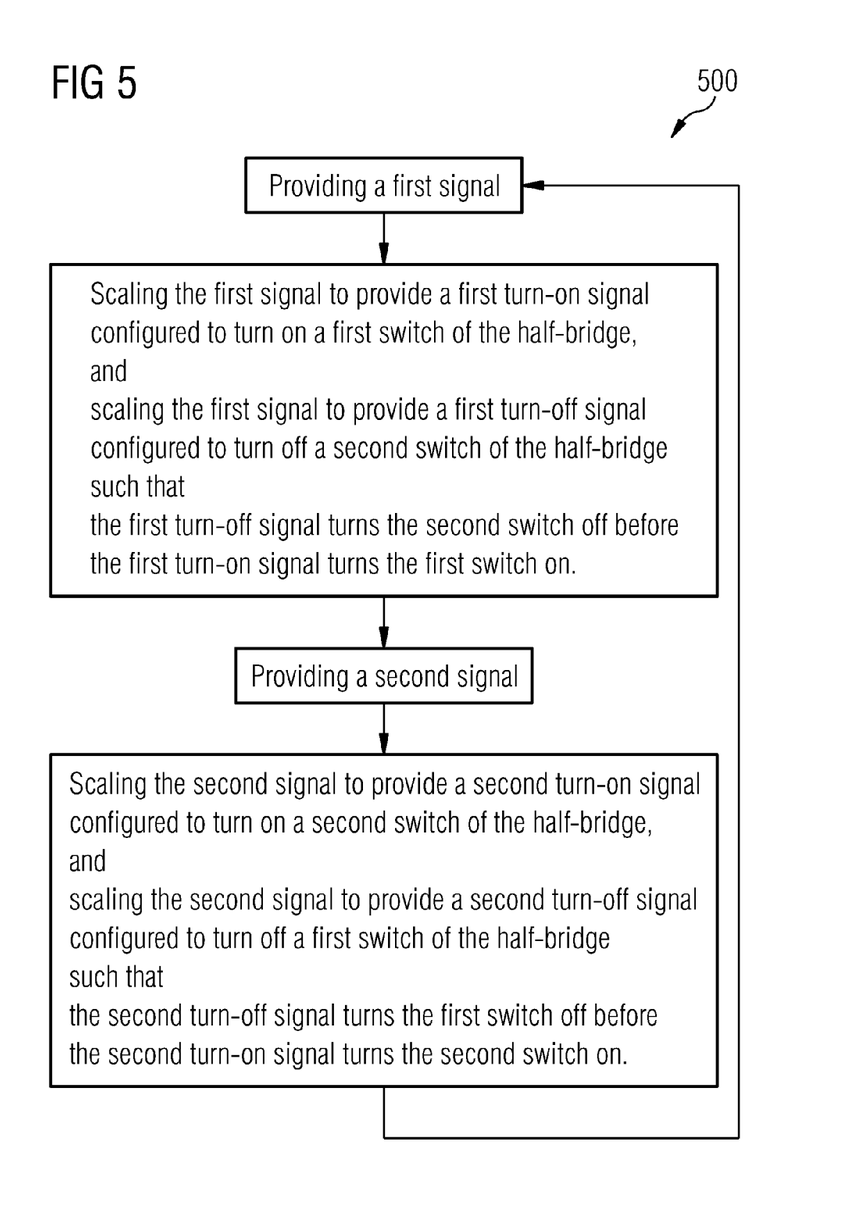
FIG. 5 shows an embodiment of a method.

FIG. 5 shows an embodiment 500 of a method for operating a half-bridge. A first signal may be provided. The first signal may be scaled to provide a first turn-on signal. The first turn-on signal may be configured to turn a first switch of the half-bridge on. The first turn-on signal may be applied to the first switch. The first signal may be scaled to provide a first turn-off signal. The first turn-off signal may be configured to turn a second switch of the half-bridge off. The first turn-off signal may be applied to the second switch. The first turn-on signal and the first turn-off signal may be scaled so that the first turn-off signal turns the second switch off before the first turn-on signal turns the first switch on. The first signal may be scaled to simultaneously provide the first turn-on signal and the first turn-off signal.

In various embodiments, the first turn-on signal and the first turn-off signal are applied at the same time to the first switch and the second switch, respectively.

In various embodiments, the first signal may be scaled to provide the first turn-on signal by means of a first current mirror. The first current mirror may be floating, that is, it is not connected to a fixed electrical potential.

In various embodiments, the first turn-on signal may be the sum of a current in a control branch of the first current mirror and a current in a controlled branch of the first current mirror.

In various embodiments, the first signal may be scaled to provide the first turn-off signal by means of the first current mirror and a third current mirror.

In various embodiments, the first turn-off signal may be a current in a controlled branch of the third current mirror. A control branch of the third current mirror may be coupled to the controlled branch of the first current mirror.

In various embodiments, a second signal may be provided. The second signal may be scaled to provide a second turn-on signal. The second turn-on signal may be configured to turn the second switch of the half-bridge on. The second turn-on signal may be applied to the second switch. The second signal may be scaled to provide a second control signal. The second turn-off signal may be configured to turn the first switch of the half-bridge off. The second turn-on signal and the second turn-off signal may be scaled so that the second turn-off signal turns the first switch off before the second turn-on signal turns the second switch on.

In various embodiments, the first signal and the second signal may be provided alternately. In other words, the first signal and the second signal may be mutually exclusive.

In various embodiments, the first signal and the second signal may be derived from a same control current.

In various embodiments, the same control current may be mirrored to provide the first signal and the second signal.

In various embodiments, a switching speed of the first switch and a switching speed of the second switch may be set via same control current. A switching speed may be given by the time needed for turning on or turning off a switch. A high switching speed may have a steeper slope or a higher slew rate than a low switching speed.

In various embodiments, a time period during which both the first switch and the second switch are off or non-conducting may be minimized by adjusting at least one of: the same control current, the scaling of the first signal, and the scaling of the second signal.

In various embodiments, the first switch and the second switch are semiconductor switches with opposite majority carriers.

In various embodiments, the method may be repeated, for example periodically. The first signal and the second signal may be provided alternately, for example with a frequency f=1/T, to operate the half-bridge.

The method may be applied to any of the embodiments 100, 200, 300, and 400. Any of the embodiments 100, 200, 300, and 400 may be used to implement the method.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit for operating a half-bridge, comprising:
a first multiplier circuit configured:
to multiply a first signal by a first factor to provide a turn-on signal configured to turn on a first switch of the half-bridge; and
to multiply the first signal by a second factor to provide a turn-off signal configured to turn off a second switch of the half-bridge; wherein the first factor and the second factor are chosen so that the second switch is turned off before the first switch is turned on; and
a first generating unit configured to provide the first signal, wherein the first generating unit comprises a first current controlled current source controlled by a control current.

2. The circuit of claim 1, wherein
the first multiplier circuit comprises:
a first current controlled current source comprising a control branch and a controlled branch, wherein
a first end of the control branch is configured to receive the first signal;
a second end of the control branch is coupled to a second end of the controlled branch and to the first switch; and
a first end of the controlled branch is coupled to the second switch.

3. The circuit of claim 2, wherein
the first current controlled current source is floating.

4. The circuit of claim 2, wherein
the first multiplier circuit further comprises:
a second current controlled current source comprising a control branch and a controlled branch, wherein
a first end of the control branch is coupled to a first end of the controlled branch of the first current controlled current source;
a second end of the control branch is coupled to a second end of the controlled branch; and
a first end of the controlled branch is coupled to the second switch.

5. The circuit of claim 1, further comprising:
a second multiplier circuit configured:
to multiply a second signal by a third factor to provide a turn-on signal configured to turn-on the second switch; and
to multiply the second signal by a fourth factor to provide a turn-off signal configured to turn-off the first switch;
wherein the third factor and the fourth factor are chosen so that the first switch is turned off before the second switch is turned on.

6. The circuit of claim 1, further comprising
a second generating unit configured to provide the second signal, wherein the second generating unit comprises a second current controlled current source controlled by the same control current that the fifth current controlled current source is controlled by.

7. The circuit of claim 6, further comprising:
a control circuit configured to activate only one of the first generating unit and the second generating unit at a time.

8. An integrated circuit, comprising:
a half-bridge circuit, wherein the half-bridge circuit comprises a first switch and a second switch coupled in series to each other, wherein the first switch and the second switch have majority carriers of opposite polarity;
a half-bridge driver circuit, wherein the half-bridge driver circuit is configured:
to multiply a first current by a first factor to provide a first turn-on current, wherein the first turn-on current is configured to turn-on the first switch;
to multiply the first current by a second factor to provide a first turn-off current, wherein the first turn-off current is configured to turn-off the second switch;
to multiply a second current by a third factor to provide a second turn-on current, wherein the second turn-on current is configured to turn-on the second switch; and
to multiply the second current by a fourth factor to provide a second turn-off current, wherein the second turn-off signal is configured to turn-off the first switch;
wherein
the first current and the second current are provided alternately;
the first factor and the second factor are chosen so that the second switch is turned off before the first switch is turned on; and
the third factor and the fourth factor are chosen so that the first switch is turned off before the second switch is turned on.

9. A method for operating a half-bridge, comprising:
providing a first signal from a first generating unit, wherein the first generating unit comprises a first current controlled current source controlled by a control current:
scaling the first signal to provide a first turn-on signal, wherein the first turn-on signal is configured to turn on a first switch of the half-bridge;
applying the first turn-on signal to the first switch;
scaling the first signal to provide a first turn-off signal, wherein the first turn-off signal is configured to turn off a second switch of the half-bridge; and
applying the first turn-off signal to the second switch;
wherein the first turn-on signal and the first turn-off signal are scaled so that the first turn-off signal turns the second switch off before the first turn-on signal turns the first switch on.

10. The method of claim 9, wherein
the first turn-on signal and the first turn-off signal are applied at the same time to the first switch and the second switch, respectively.

11. The method of claim 9, wherein
the first signal is scaled to provide the first turn-on signal by means of a first current mirror, wherein the first current mirror is floating.

12. The method of claim 11, wherein
the first turn-on signal is the sum of a current in a control branch of the first current mirror and a current in a controlled branch of the first current mirror.

13. The method of claim 11, wherein
the first signal is scaled to provide the first turn-off signal by means of the first current mirror and a third current mirror.

14. The method of claim 13, wherein
the first turn-off signal is a current in a controlled branch of the third current mirror, wherein a control branch of the third current mirror is coupled to a controlled branch of the first current mirror.

15. The method of claim 9, further comprising:
providing a second signal;
scaling the second signal to provide a second turn-on signal, wherein the second turn-on signal is configured to turn on the second switch of the half-bridge;
applying the second turn-on signal to the second switch;
scaling the second signal to provide a second turn-off signal, wherein the second turn-off signal is configured to turn off the first switch;
applying the second turn-off signal to the first switch of the half-bridge;
wherein the second turn-on signal and the second turn-off signal are scaled so that the second turn-off signal turns the first switch off before the second turn-on signal turns the second switch on; and
wherein the first signal and the second signal are provided alternately.

16. The method of claim 15, further comprising:
deriving the first signal and the second signal from a same control current.

17. The method of claim 16, wherein
the same control current is mirrored to provide the first signal and the second signal.

18. The method of claim 16, further comprising:
setting a switching speed of the first switch and a switching speed of the second switch via the same control current.

19. The method of claim 9, further comprising:
minimizing a time period during which both the first switch and the second switch are non-conducting by adjusting at least one of:
the magnitude of the same control current;
the scaling of the first signal; and
the scaling of the second signal.

* * * * *